(12) United States Patent
Heck et al.

(10) Patent No.: US 8,428,544 B2
(45) Date of Patent: Apr. 23, 2013

(54) HETERODYNE COMMUTATING MIXER APPARATUS

(75) Inventors: Joseph P. Heck, Fort Lauderdale, FL (US); Stephen L. Kuffner, Algonquin, IL (US)

(73) Assignee: Motorola Solutions, Inc., Schaumburg, IL (US)

( * ) Notice: Subject to any disclaimer, the term of this patent is extended or adjusted under 35 U.S.C. 154(b) by 98 days.

(21) Appl. No.: 13/191,748

(22) Filed: Jul. 27, 2011

(65) Prior Publication Data

US 2013/0028356 A1    Jan. 31, 2013

(51) Int. Cl.
*H04B 1/26* (2006.01)
(52) U.S. Cl.
USPC ........... 455/323; 455/131; 455/133; 455/315; 455/326; 327/355; 327/356; 327/357; 327/358; 331/2; 331/7; 331/36 L
(58) Field of Classification Search .................. 455/131, 455/133, 189.1, 190.1, 193.2, 207, 208, 209, 455/236.1, 260, 264, 293, 315, 323, 326; 327/113, 355–359, 361; 331/2, 7, 36 L
See application file for complete search history.

(56) References Cited

U.S. PATENT DOCUMENTS

| 6,230,000 B1 | 5/2001 | Tayloe |
| 6,278,870 B1 | 8/2001 | Davie et al. |
| 2011/0156829 A1* | 6/2011 | Wang ...................... 331/117 FE |

* cited by examiner

*Primary Examiner* — Tuan Pham

(57) ABSTRACT

Heterodyne commutating apparatuses and methods for creating the heterodyne commutating apparatuses are disclosed. The heterodyne commutating mixer includes a plurality of switches for transferring a radio frequency input signal sequentially during a plurality of local oscillator period timeslots to a plurality of output capacitors. The heterodyne commutating mixer also includes a plurality of inductors added across differential in-phase output terminals and quadrature output terminals. Values of inductance and capacitance are set to achieve resonance at an output intermediate frequency.

26 Claims, 16 Drawing Sheets

| SINGLE BALANCED HETERODYNE MIXER PERFORMANCE PARAMETERS @ 100 MHz IF OUTPUT → | | V GAIN FROM MIXER RF IN TO i-ix OR q-qx (dB) | V GAIN FROM MIXER RF IN TO COMBINER Rload (dB) | V GAIN FROM RF SOURCE -6dB (-33.98 dBVpk) TO COMBINER Rload (dB) | POWER GAIN TO I + Q OUTPUT LOADS OR COMBINER Rload (dB) | NOISE FIGURE (SSB) @ 100 MHz IF OUT (dB) | NOISE FIGURE (SSB) MAX OVER 90 TO 110 MHz (dB) | MAGNITUDE Zin @ frf = flo + fif (OHMS) | IIP3, [frf1=flo + 100.9 MHz, frf2=flo +101 MHz] (dBm) | IMAGE SUPPRESSION AT 100 MHz IF OUT (dB) | MIN IMAGE SUPPRESSION OVER 90 TO 110 MHz (dB) |
|---|---|---|---|---|---|---|---|---|---|---|---|
| CASE 1 I CHANNEL MIXER ONLY | LO DUTY CYCLE = 50% Rload=1M | 7.27 | NA | NA | -28.71 | 5.18 | 5.19 | 252.80 | 10.60 | NA | NA |
| | Rload=20K | 7.03 | NA | NA | -12.21 | 5.42 | 5.43 | 238.40 | 9.92 | NA | NA |
| | Rload=2K | 5.10 | NA | NA | -5.61 | 7.14 | 7.15 | 169.70 | 8.74 | NA | NA |
| | Rload=200 | -4.66 | NA | NA | -7.71 | 13.44 | 13.44 | 99.00 | 10.74 | NA | NA |
| | LO DUTY CYCLE = 25% Rload=1M | 5.86 | NA | NA | -21.61 | 4.70 | 4.70 | 1790.00 | 15.91 | NA | NA |
| | Rload=20K | 5.36 | NA | NA | -6.29 | 5.10 | 5.10 | 1367.00 | 21.11 | NA | NA |
| | Rload=2K | 1.78 | NA | NA | -3.64 | 7.69 | 7.70 | 574.40 | 19.72 | NA | NA |
| | Rload=200 | -11.18 | NA | NA | -9.27 | 15.16 | 15.17 | 310.40 | 23.59 | NA | NA |
| CASE 2 I+Q MIXERS | LO DUTY CYCLE = 50% Rload=1M | 4.66 | NA | NA | -33.69 | 11.35 | 11.93 | 73.06 | 18.65 | NA | NA |
| | Rload=20K | 4.48 | NA | NA | -16.94 | 11.50 | 12.05 | 72.19 | 19.22 | NA | NA |
| | Rload=2K | 2.98 | NA | NA | -8.84 | 12.71 | 13.07 | 65.80 | 18.87 | NA | NA |
| | Rload=200 | -5.24 | NA | NA | -8.33 | 18.12 | 18.16 | 49.10 | 16.59 | NA | NA |
| | LO DUTY CYCLE = 25% Rload=1M | 6.66 | NA | NA | -21.39 | 4.88 | 5.10 | 783.10 | 21.11 | NA | NA |
| | Rload=20K | 6.50 | NA | NA | -5.85 | 5.28 | 6.27 | 581.90 | 18.51 | NA | NA |
| | Rload=2K | 5.12 | NA | NA | -1.97 | 7.85 | 7.91 | 195.10 | 17.84 | NA | NA |
| | *Rload=200 | -3.13 | NA | NA | -5.21 | 15.28 | 15.28 | 62.01 | 19.02 | NA | NA |
| CASE 3 I+Q MIXERS IMAGE BALANCED, NO IF BUFFERS - PASSIVE IMAGE BALANCED MIXER | LO DUTY CYCLE = 25% Rload=1M | 8.02 | 10.95 | 10.66 | -26.34 | 1.87 | 2.11 | 186.60 | 18.75 | -33.41 | -12.56 |
| | Rload=20K | 7.68 | 10.58 | 10.29 | -9.73 | 1.87 | 2.11 | 186.30 | 18.58 | -33.31 | -12.58 |
| | Rload=2K | 5.68 | 7.74 | 7.41 | -2.62 | 1.86 | 2.10 | 184.10 | 17.90 | -32.86 | -12.67 |
| | Rload=1K | 5.00 | 5.39 | 5.04 | -1.99 | 1.83 | 2.05 | 182.70 | 17.78 | -33.14 | -12.71 |
| | Rload=200 | 6.16 | -3.76 | -4.22 | -4.28 | 1.82 | 2.04 | 177.40 | 18.08 | -40.85 | -12.47 |
| | *Rload=200 | 6.49 | -3.24 | -4.21 | -4.29 | 1.75 | 1.96 | 157.10 | 22.13 | -26.69 | -12.44 |
| CASE 4 I+Q MIXERS IMAGE BALANCED, IDEAL UNITY V-GAIN IF BUFFERS | LO DUTY CYCLE = 25% Rload=1M | 6.67 | 5.92 | 10.07 | -25.12 | 2.41 | 2.55 | 786.80 | 21.31 | -43.41 | -43.35 |
| | Rload=20K | 6.67 | 5.88 | 10.03 | -8.17 | 2.41 | 2.55 | 786.30 | 21.31 | -43.41 | -43.35 |
| | Rload=2K | 6.67 | 5.50 | 9.65 | 1.45 | 2.41 | 2.55 | 786.90 | 21.31 | -43.41 | -43.35 |
| | Rload=200 | 6.67 | 2.39 | 6.53 | 8.35 | 2.41 | 2.55 | 788.20 | 21.34 | -43.41 | -43.35 |

HETERODYNE COMMUTATING MIXER APPARATUS

FIELD OF THE DISCLOSURE

The present disclosure relates generally to heterodyne commutating mixer structures and more particularly to providing new heterodyne commutating mixer structures that achieve significant improvements over current heterodyne mixers and provide for an efficient and low cost implementation of image rejection.

BACKGROUND

A mixer is used in radio receiver architecture to translate a signal from a given center frequency to another. A direct conversion receiver (DCR) is a radio receiver design that translates the frequency of an incoming radio signal using a local oscillator (LO) whose frequency is identical to, or very close to, the carrier or center frequency of an intended signal. Accordingly in a DCR, the input radio frequency (RF) signal center frequency is converted to essentially zero Hertz (Hz). Recent developments in radio receiver art have shown that in the DCR, when compared to other passive or active mixer structures, a commutating mixer (also known as a Tayloe mixer) can achieve significant improvements in gain, noise figure, and intermodulation distortion performance.

FIG. 1 is a schematic diagram of a conventional single-balanced Tayloe mixer configuration as could be used for direct conversion to baseband in a DCR or a zero intermediate frequency (IF) receiver. This configuration provides excellent performance for the DCR architecture, in which the LO frequency is set essentially equal to the center frequency or carrier frequency of the received RF signal. The Tayloe mixer provides a low-pass response IF in-phase (I) and quadrature phase (Q) outputs. An essential feature of the Tayloe mixer is that the duty cycle of each of the four LO waveforms is near twenty five percent (25%), as shown in FIG. 1. In fact, the duty cycle can be considerably less than twenty five percent (25%) with relatively little impact on performance However, the gain, noise figure, and other performance criteria begin to degrade as the duty cycle increases above twenty five percent (25%).

Its inherent low-pass IF response makes the Tayloe mixer unsuitable for use in radio receiver applications that require a heterodyne mixer. In a heterodyne mixer, the input RF signal center frequency and the LO frequency are separated by a relatively large difference, which is equal to the IF of the mixer output signal. For a heterodyne mixer where the IF output may be above 100 mega-Hertz (MHz), the low-pass response of the Tayloe mixer makes it disadvantageous when compared to a standard switching mixer using fifty percent (50%) duty cycle LO waveforms and with no capacitance added at the mixer output terminals.

In the Tayloe mixer shown in FIG. 1, the RF input signal is transferred sequentially during four quarter LO period timeslots by four switches 102a-102d to four output capacitors 104a-104d and the I and Q outputs are taken differentially. This is the simplest balanced commutating IQ mixer structure, and is "single balanced" in the sense that I and Q output signals are differential, while the RF input is single ended. A "double balanced" structure, as shown in FIG. 2 may also be used. The double balanced structure, shown in FIG. 2, provides for differential RF input, and is formed by providing four (4) additional switches 102e-102h from the negative side of the RF source.

For a variety of reasons, some radio receiver applications may require a heterodyne architecture, as opposed to direct conversion architecture. FIG. 3 is a schematic diagram of a conventional double balanced switching IQ mixer, which uses fifty percent (50%) duty cycle complementary LO switching waveforms. This configuration can be used in DCR as well as heterodyne mixing applications. While I and Q mixers are shown, as would be used in a DCR, a single mixer would normally be used for heterodyne mixer applications, where only one output is usually needed. Only a small amount of IF output capacitance is tolerable with the mixer shown in FIG. 3. Note the similarity between the double balanced IQ Tayloe mixer, shown in FIG. 2, and the double balanced switching mixer shown in FIG. 3. The primary differences between the mixers of FIG. 2 and FIG. 3 are the use of twenty five percent (25%) duty cycle LO waveforms plus the addition of the output capacitors 104 on the Tayloe mixer. Nevertheless, these seemingly minor differences have proven to effect a significant improvement in several key mixer performance criteria, such as noise figure, gain, and third order inter-modulation intercept point in DCR implementations.

Heterodyne mixers normally respond equally to RF input signals either above or below the LO frequency separated by a frequency difference equal to the IF. However, only one of these responses is normally desired. In addition to creating an undesired response (image response) at the image frequency, the noise at the image frequency is also converted to the IF output, which degrades the noise figure of a heterodyne mixer by up to three (3) dB.

Accordingly, there exists a need for new heterodyne mixer structures that achieve significant improvements over current heterodyne commutating mixers and provide for an efficient and low cost implementation of image rejection.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

FIG. 7 is a table of simulation results for heterodyne mixers for several configurations and output load resistance.

Figure 1:
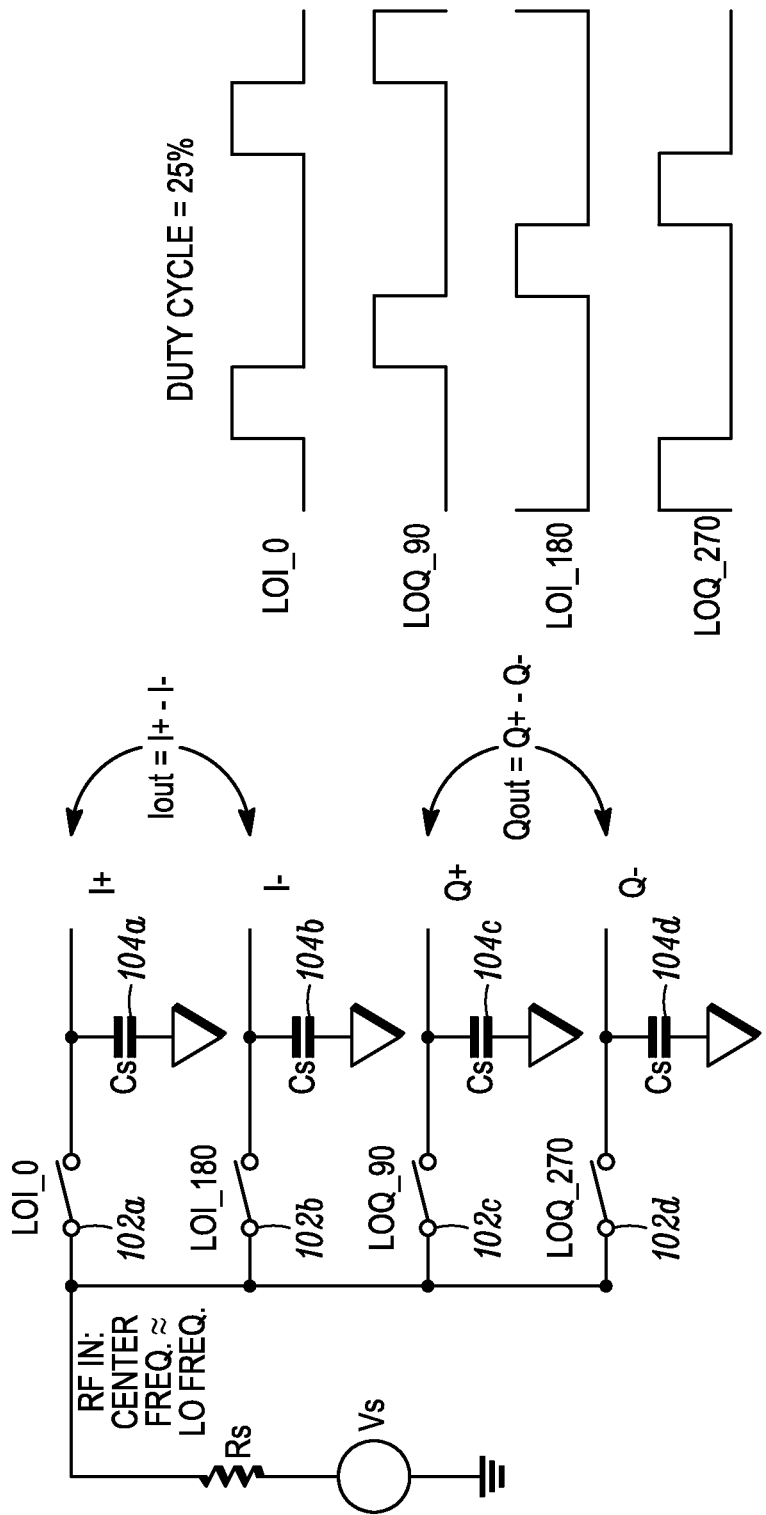
FIG. 1 is a schematic diagram of a conventional single-balanced Tayloe mixer configuration.
Figure 2:
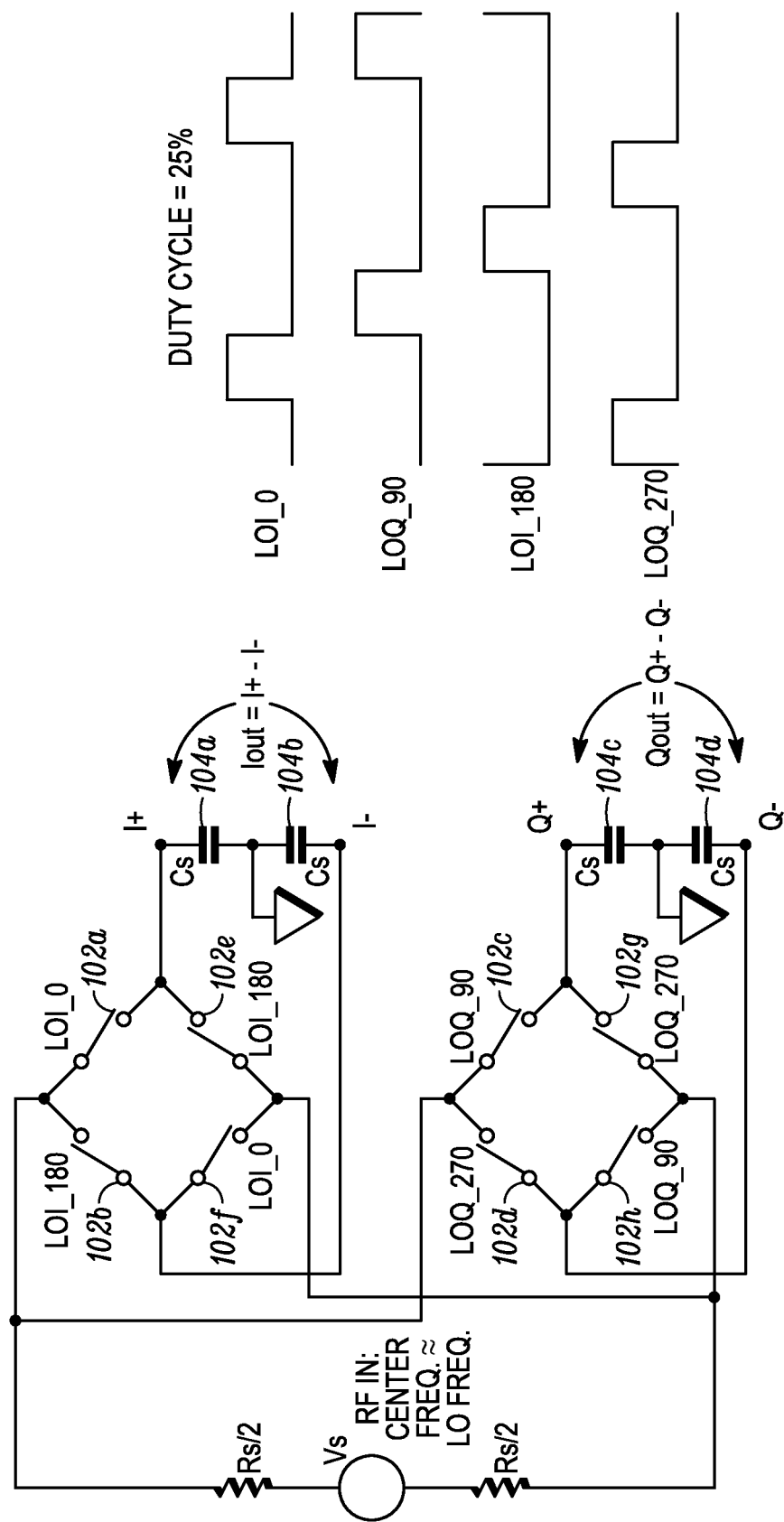
FIG. 2 is a schematic diagram of a conventional double-balanced Tayloe direct conversion mixer configuration.
Figure 3:
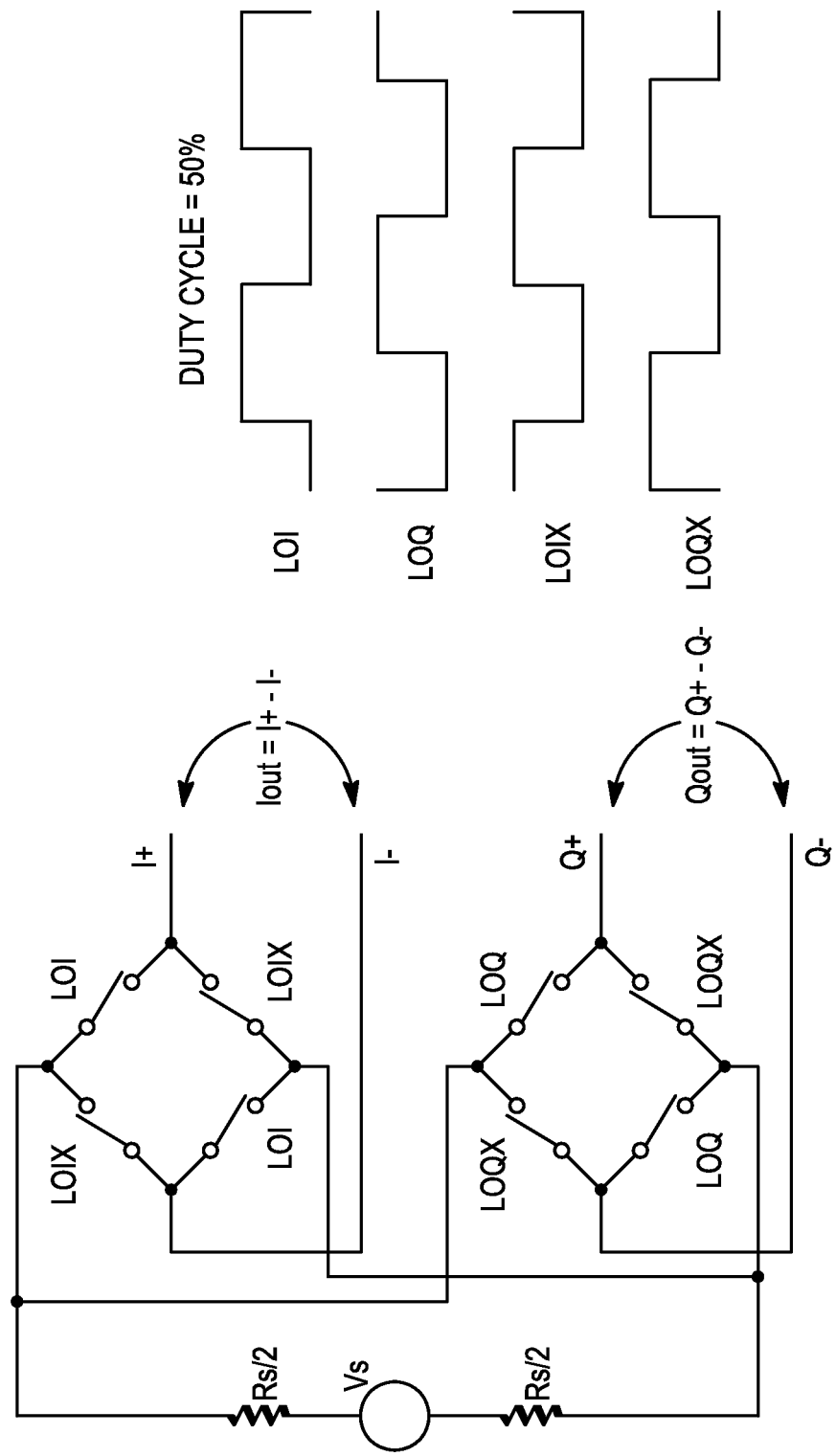
FIG. 3 is a schematic diagram of a conventional double balanced IQ switching mixer, which uses fifty percent duty cycle complementary local oscillator switching waveforms.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention. One experienced in the art will appreciate that details such as possible use of a balun to drive the differential RF input port, and some DC biasing elements have been left off the drawings for the sake of clarity. In each of the drawings, the RF signal source is shown as a voltage source Vs along with a representation of its inherent source impedance, Rs.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Some embodiments are directed to heterodyne commutating mixer apparatuses and methods for creating the heterodyne commutating apparatuses. The heterodyne commutating mixer includes a plurality of switches for transferring a radio frequency input signal during a plurality of sequential local oscillator period timeslots to a plurality of output capacitors. The heterodyne commutating mixer also includes a plurality of inductors added across differential in-phase output terminals and quadrature output terminals. Values of inductance and capacitance are set to achieve resonance at an output intermediate frequency. The heterodyne commutating mixer may also include a quadrature phase combiner configured to receive in-phase output signals and quadrature-phase output signals and to cancel an unwanted image response. The heterodyne commutating mixer may further include a plurality of intermediate frequency buffers configured to receive in-phase output signals and quadrature phase output signals and to provide output signals to the quadrature phase combiner.

Figure 4A:
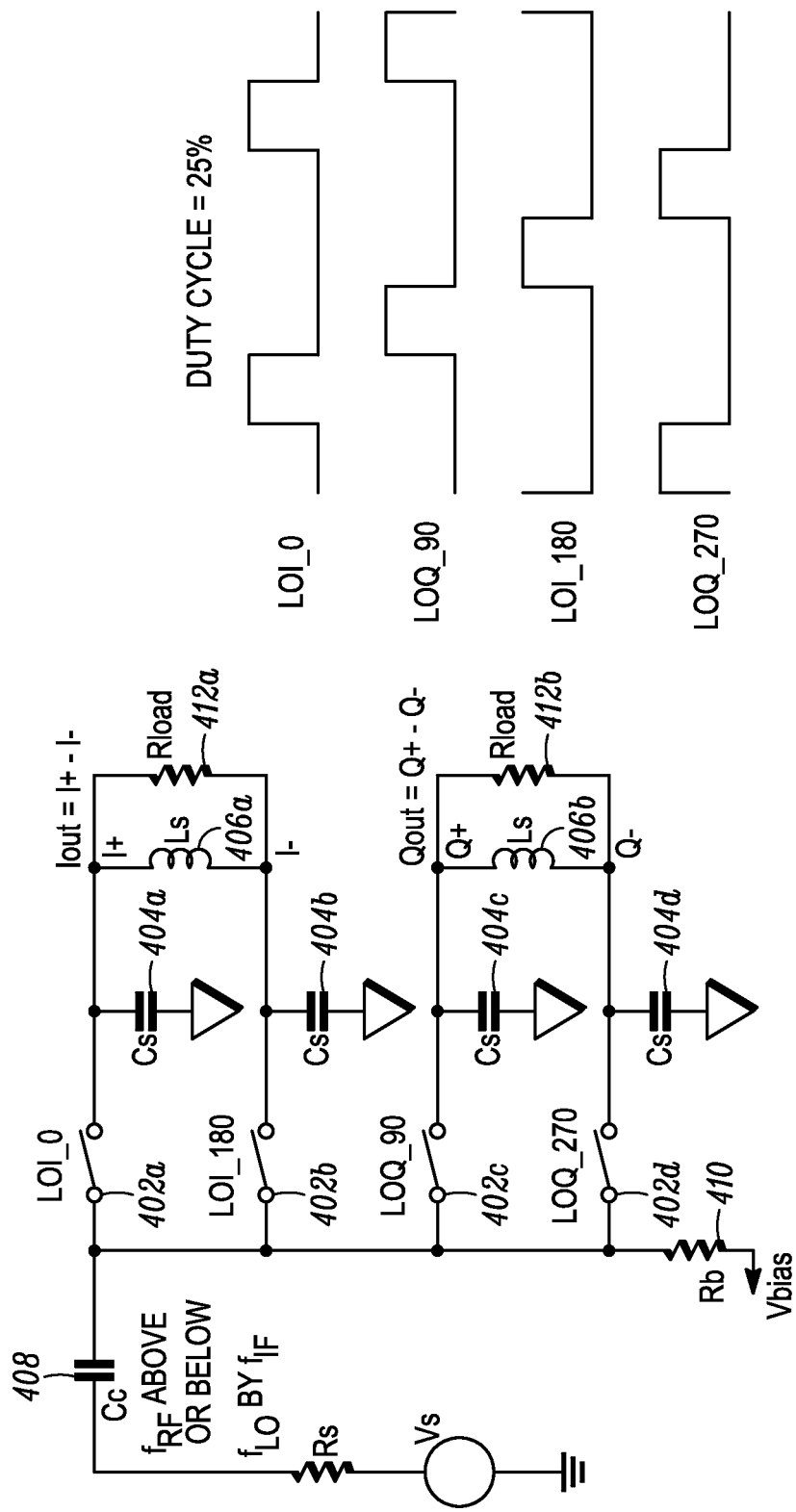
FIG. 4A is a schematic diagram of a heterodyne commutating IQ mixer in accordance with some embodiments.

FIG. 4A is a schematic diagram of a heterodyne commutating IQ mixer used in accordance with some embodiments.

A radio frequency (RF) input signal is transferred sequentially during four sequential quarter local oscillator (LO) period timeslots (LOI_0, LOI_90, LOQ_180, LOQ_270) by four switches 402a-402d to four output capacitors (Cs) 404a-404d and in-phase (I) and quadrature-phase (Q) outputs are taken differentially. Each switch is closed when its LO waveform is high as illustrated in the figure. In FIG. 4A, I and Q output signals are differential, while the RF input is single ended. Inductors of value Ls 406a-406b are added across the differential I and Q output terminals to provide resonance at the output intermediate frequency (IF). The output inductance for this case is connected differentially in order to preserve the common-mode direct current (DC) voltage at the mixer outputs. The mixer output signals are taken differentially at the I+ to I– terminals for the in-phase output and at the Q+ to Q– terminals for the quadrature-phase output. Resistors 412a-412b of value Rload are optionally connected across the mixer outputs. These load resistors represent the loading of the next stage in the system in which the mixers are used, and are not necessarily part of the mixer itself. A load of essentially infinite impedance could be used.

It is often desirable to bias the DC voltage at the RF input and IF outputs at some positive value above ground potential, and in this case coupling capacitor 408 could be used in conjunction with bias resistor 410 which connects to an appropriate bias voltage source. The value of the bias resistor would be made much larger than the source impedance to avoid loading the input. A "choke" or inductor could alternatively be used in place of the bias resistor. In an embodiment (not shown), the bias resistor or inductor 410 could be removed, and the two output inductors 406a-406b could be replaced by four inductors, connecting one side of each inductor to each of the positive and negative in-phase and quadrature terminals (I+, I–, Q+ and Q–), with the other side of each inductor connected to a DC voltage at the desired common-mode DC potential (Vbias); in this case, the coupling capacitor 408 would typically be used between the RF source and the common input of the switches. In another embodiment (not shown), the inductors 406a-406b would remain as shown, the bias resistor 410 would be removed and replaced by four high valued bias resistors, connecting one side of each bias resistor to each of the positive and negative I and Q terminals (I+, I–, Q+ and Q–), with the other side of each of the four bias resistors connected to a DC voltage at the desired common-mode DC potential (Vbias). Those skilled in the art will appreciate that other alternative means for achieving the desired DC bias voltage level could also be used, including use of a transformer at the RF input with the appropriate DC bias voltage applied to a terminal or center tap of the transformer, and that any of these means could be applied to any of the representative circuits shown in FIGS. 4A, 4B, 6A, 6B, 8A, 8B, 10A, 10B.

The values of the inductance (Ls) and capacitance (Cs) are set to achieve resonance at the output intermediate frequency. For example, for an intermediate frequency (IF) output of 100 MHz, a value of 4 pico-Farad (pF) for Cs and 1.267 micro-Henry (pH) for Ls could be used. (Half the value of Cs is used in the resonance calculation, since the capacitors on the differential outputs are effectively in series.) Higher values for Cs with proportionately lower values of Ls could, of course, be used to achieve a higher resonant circuit quality factor and narrower bandwidth, or lower values of Cs with proportionately higher values of Ls would achieve lower quality factor and wider bandwidth, as is well known in the art of resonant circuits.

Figure 4B:
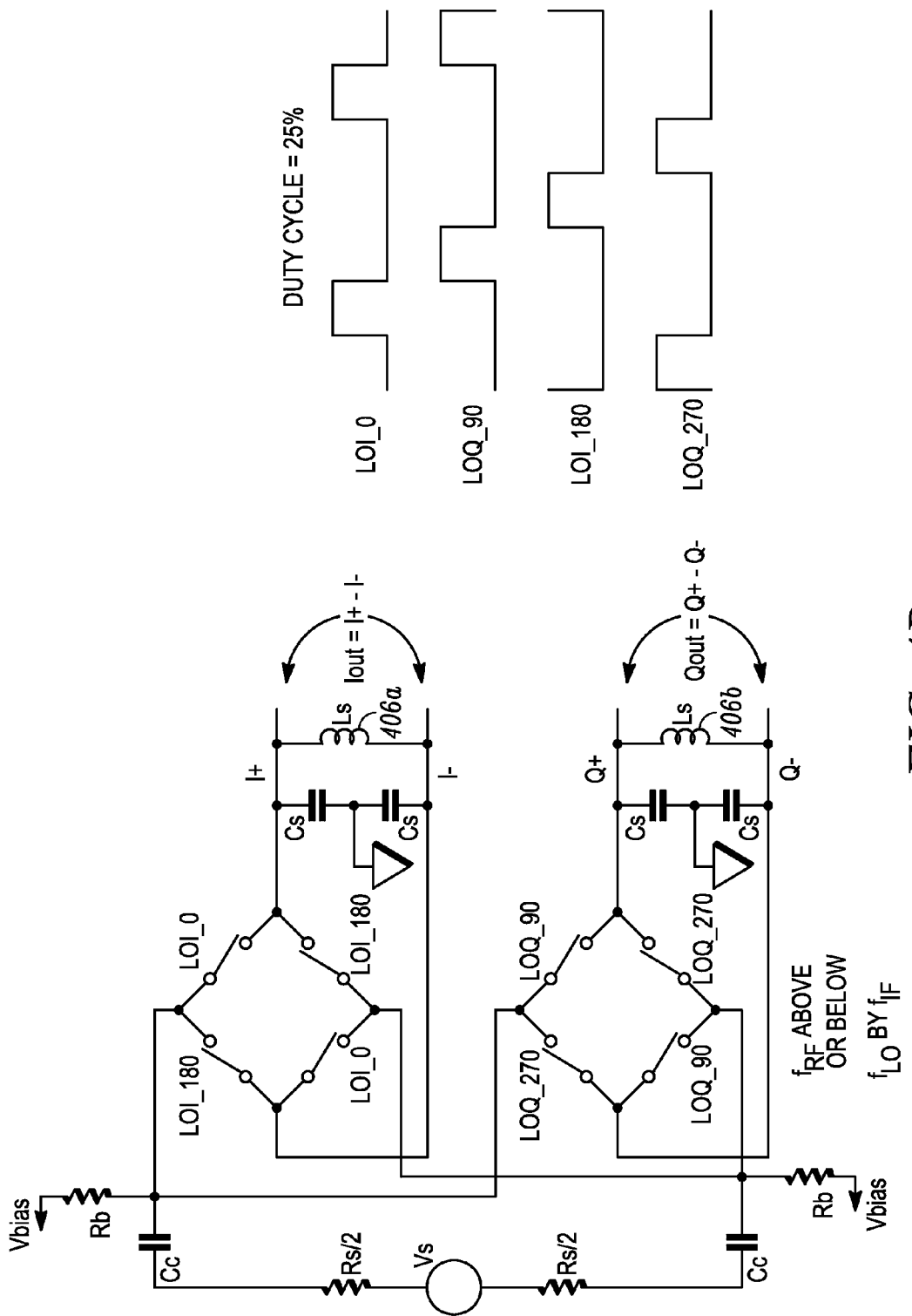
FIG. 4B is another schematic diagram of a heterodyne commutating IQ mixer in accordance with some embodiments.

FIG. 4B is another schematic of a heterodyne commutating IQ mixer used in accordance with some embodiments. Similar to the configuration of FIG. 4A, inductors of value Ls 406a-406b are added across the differential in-phase (I) and quadrature-phase (Q) outputs to provide resonance at the output intermediate frequency (IF). The output inductance is connected differentially in order to preserve the common-mode DC voltage at the mixer outputs. The heterodyne commutating IQ mixer of FIG. 4B is a double balanced structure that provides for differential RF input, and is formed by providing additional switches from the negative side of the RF source. As is well known in the art, such differential RF input could be provided from a normal ground referenced RF source through means of a transformer or balun, or the differential input could simply come from another circuit, such as a low noise amplifier with differential outputs. The RF input source Vs and its inherent source impedance Rs represent the signal that drives the RF input of the mixer, and may come from a previous stage, such as a low noise amplifier, or from an antenna or a signal generator.

Figure 5:
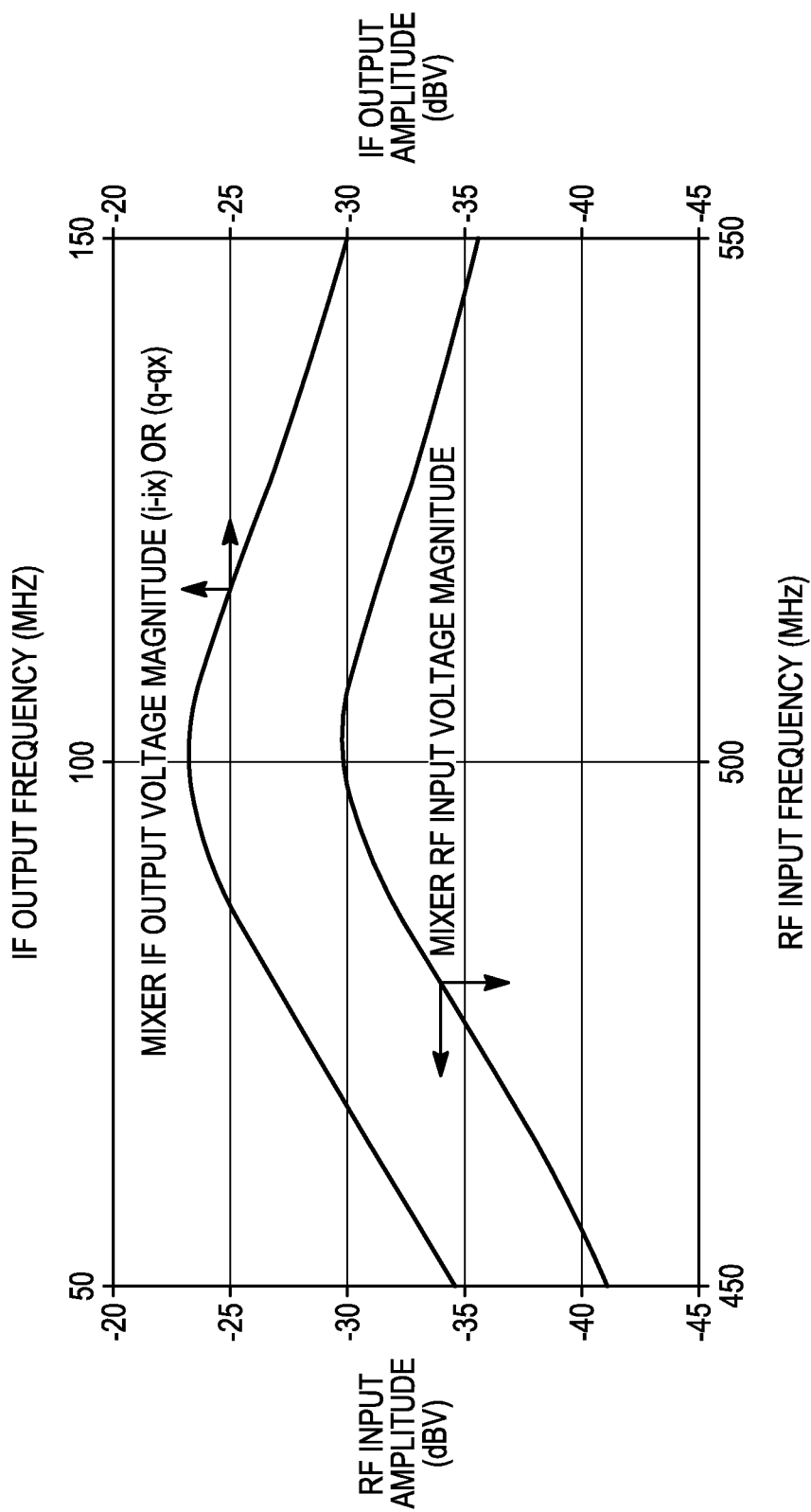
FIG. 5 is a diagram of representative simulation responses for the circuit shown in FIG. 4A in accordance with some embodiments.

FIG. 5 shows representative simulation responses for the circuit of FIG. 4A, with Rs=200 Ohms, Rload=1M Ohm, $f_{LO}$=400 MHz, LO duty cycle=25%, and $f_{RF}$ swept from 450 MHz to 550 MHz. In FIG. 5, it can be seen that the band-pass frequency response at the IF output is reflected to the RF input port, providing a band-pass response centered at the center of the desired RF signal frequency for a given LO frequency. The center of this response changes with the LO frequency and remains at the center of the desired RF signal frequency. This desirable result is similar to what happens with a Tayloe direct conversion mixer where the IF low-pass response is reflected to a band-pass response at the RF input, and this desirable characteristic of the commutating mixer is preserved for the band-pass IF implementation carried out in embodiments of the present invention. It can be seen that the mixer has voltage gain of about 6.7 dB from the RF input port to the in-phase (I) and quadrature-phase (Q) IF output ports for the given conditions at the center frequency. Other simulation results for the same set of circuit conditions and for several other conditions can be found in the table of FIG. 7 as discussed below.

It should be remembered that heterodyne mixers have an image response as well as the desired response. In FIG. 5, the RF input frequency (nominally 500 MHz) is set above the LO frequency of 400 MHz to produce an IF output centered at 100 MHz. The mixer as shown in FIG. 4 has an essentially equal response at the IF output at 100 MHz to an RF signal at 300 MHz as for an input at 500 MHz. Usually the image response is undesired. The heterodyne commutating mixer structures of FIG. 4A and FIG. 4B allow for I and Q mixers (i.e., the addition of a second mixer) with little or no detrimental impact due to impedance changes or other factors as compared to a single I or Q mixer. This makes the heterodyne commutating mixer structures of FIG. 4A and FIG. 4B ideal for implementation of an image balanced or image reject mixer, as shown in FIG. 6A and FIG. 6B and described below.

Figure 6A:
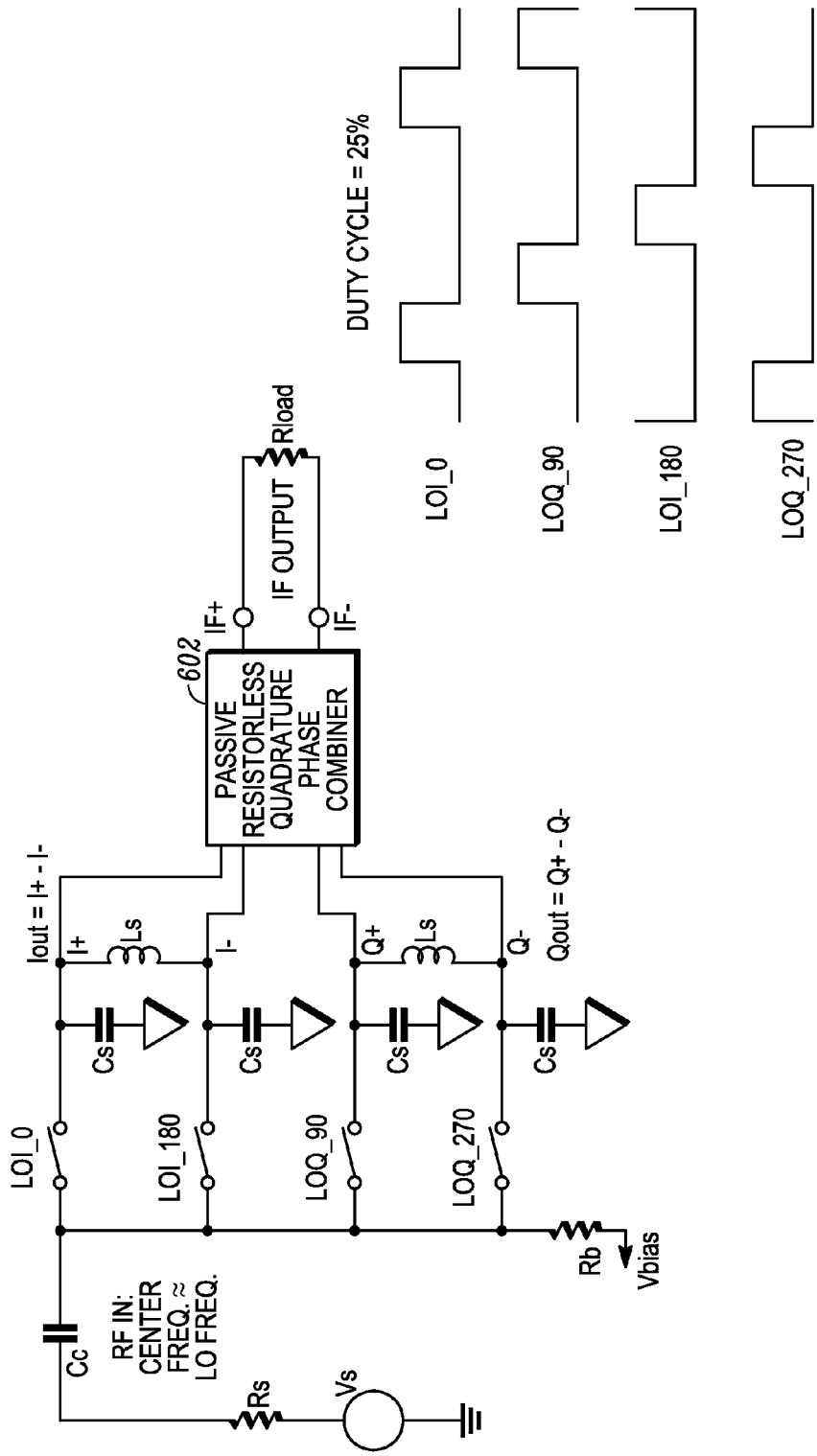
FIG. 6A is a schematic diagram of an image reject heterodyne commutating IQ mixer in accordance with some embodiments.
Figure 6B:
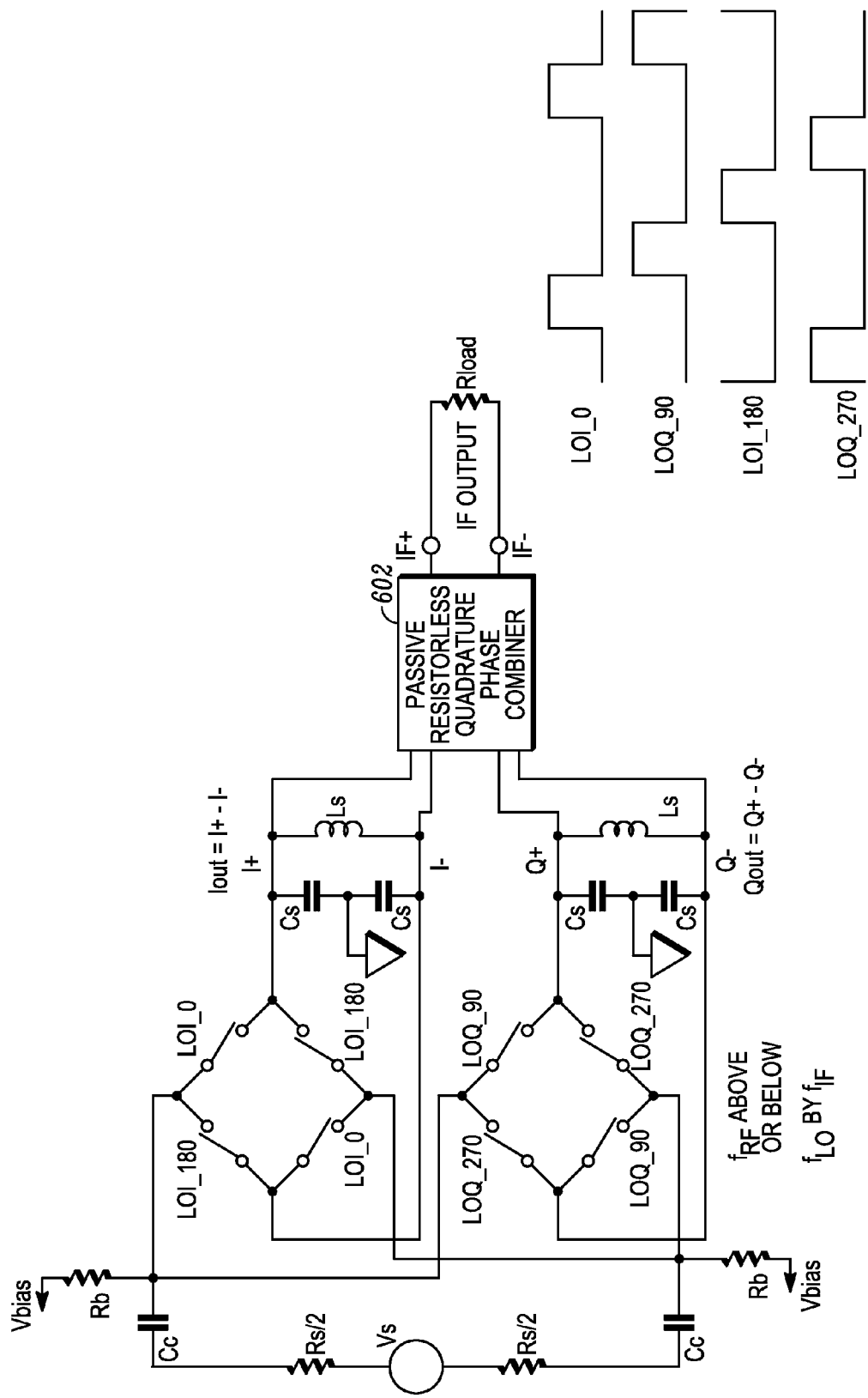
FIG. 6B is another schematic diagram of an image reject heterodyne commutating IQ mixer in accordance with some embodiments.

The structures of FIGS. 6A and 6B use the heterodyne commutating mixer structures of FIG. 4A and FIG. 4B to implement an efficient image reject mixer. The image rejection can be used to not only significantly attenuate the unwanted image response (allowing lower specification requirements and lower cost of the radio receiver's front end pre-selector filters which are used to attenuate the image response), it can also be used to improve the (single sideband) noise figure of the mixer by approximately 3 dB. The new mixer topologies described herein have application, for example, in high performance dual conversion receivers, which may include base station receivers.

Figure 9:
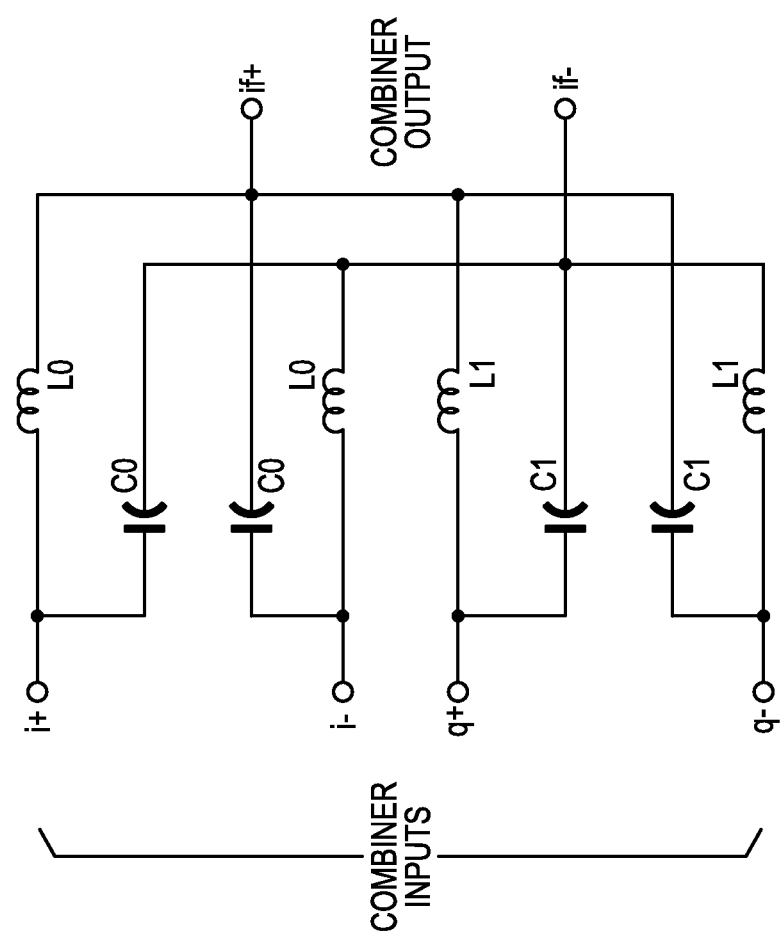
FIG. 9 shows a schematic diagram of a passive LC phase combiner which serves as an example of an implementation of the phase combiner function.

FIG. 6A is a schematic diagram of an image reject heterodyne commutating IQ mixer used in accordance with some embodiments. In FIG. 6A, a passive quadrature phase combiner 602 is added to the structure of FIG. 4A to achieve the cancellation of the unwanted image. The selection of the high side or low side response can be achieved by reversing the positive (+) and negative (−) terminals on either I+ and I− OR the Q+ and Q− terminals (but not both). There are many active and passive circuits known for achieving quadrature phase combining, but a totally passive (LC) and resistor-less network has the advantage of being reasonably practical for an IF of 10 MHz or less to 150 MHz or more, and can be nearly lossless and thus will preserve the noise figure of the image balanced mixer. FIG. 9 shows an example of a structure of such an LC phase combiner, as is well known in the literature. See for example, S. Darlington, "Realization of a Constant Phase Difference", BSTJ, Vol. 29, pp. 94-104, January 1950. The design values of the inductors and capacitors for this combiner are dependent upon the driving impedance at the combiner inputs and the frequency range over which an accurate 90 degree phase shift is needed. The driving impedance is primarily set by the characteristics of the devices used for the switches in the mixer and the RF source impedance. The combiner as shown in FIG. 9 provides differential inputs and output, but the output can be made single ended by simply grounding one of the output terminals, either directly or via a capacitor to preserve the DC bias.

FIG. 6B is another schematic diagram of an image reject heterodyne commutating IQ mixer used in accordance with some embodiments. In FIG. 6B, a passive quadrature phase combiner 602 is added to the structure of FIG. 4B to achieve a double balanced image reject heterodyne commutating IQ mixer.

A heterodyne mixer's noise figure should be taken as the so-called Single Sideband Noise Figure (NFssb). (See, for example, Agilent Technologies, Application Note AN57-1, "Fundamentals of RF and Microwave Noise Figure Measurements," p. 25, August 2010.) This definition of noise figure takes into account that the noise converted to the output of a heterodyne mixer comes from both the desired and image frequency bands (along with possible noise contributions at the IF output circuits) while the signal is converted only from the desired frequency band. (The single sideband refers to the desired signal band as opposed to the image band, and has nothing to do with the type of modulation used on the signal.) NFssb is basically 3 dB worse than the Double Sideband Noise Figure (NFdsb) when there are no frequency selective filters present in the path to the RF input of the mixer. In a direct conversion mixer, the signal and the noise both convert from both sidebands, so the NFdsb is the appropriate measure of noise figure for a direct conversion mixer. All else being equal, the noise figure achieved with a given mixer circuit is essentially 3 dB worse when used in heterodyne mode (without image balancing) versus direct conversion mode. An image balanced mixer not only attenuates the image response of unwanted signals in the image band, but it also prevents most of the noise at the image band from converting to the output and can provide up to 3 dB of improvement in the single sideband noise figure for the heterodyne case. An image balanced mixer uses a ninety (90) degree (or quadrature) phase shift on any two of the three mixer ports: RF input port, LO input port, IF output port. The IQ commutating mixer inherently uses quadrature LO signals. While a quadrature splitter could be provided on the RF input port, some means of combining the IF outputs would still be needed, preferably in a lossless manner. Therefore, a practical approach is to provide quadrature combining on the IF outputs, as shown in FIGS. 6A and 6B. An example of a passive LC phase combiner is shown in FIG. 9.

Figure 10A:
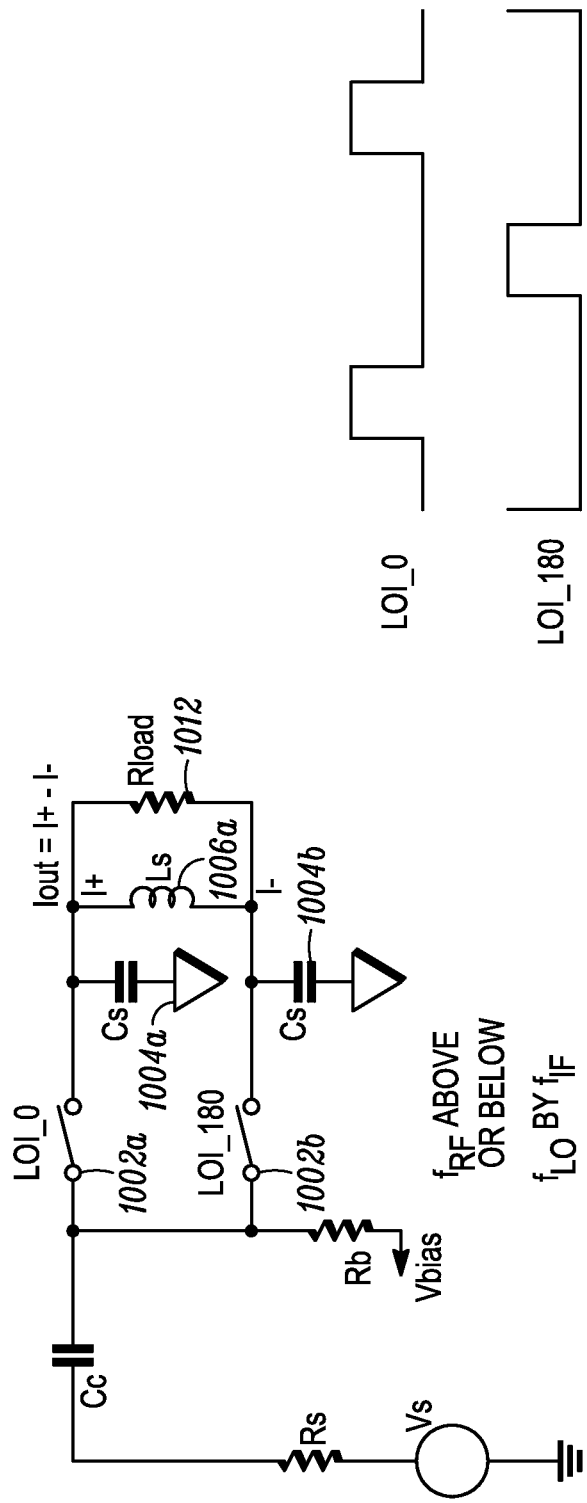
FIG. 10A is a schematic diagram of a single balanced commutating heterodyne mixer with a single differential output, which could be used in heterodyne applications in which both I and Q outputs are not needed.

FIG. 7 is a table of simulation results for heterodyne mixers for several configurations and output load resistance. The first set of comparisons (Case 1) is for a single heterodyne mixer with twenty five percent (25%) versus fifty percent (50%) duty cycle. The mixer circuit in Case 1 is as shown in FIG. 10A with load resistors of value Rload applied across the I+ to I− outputs. Performance parameters for 25% and 50% LO duty cycles are shown for this circuit configuration in Case 1. The simulations for Case 1 show that noise figure is better for twenty five percent (25%) duty cycle, and that third order inter-modulation intercept point (IIP3) is approximately five (5) to eleven (11) dB better with twenty five percent (25%) duty cycle. The input impedance is a factor of approximately three (3) to seven (7) times higher with twenty five percent (25%) duty cycle, resulting in greater power gain, except when Rload=200 Ohms.

The second set of comparisons (Case 2) is for I+Q mixers, as shown in FIG. 4A, with LO duty cycle of twenty five percent (25%) versus fifty percent (50%). The noise figure is approximately 6.5 dB better with twenty five percent (25%) duty cycle. The power gain is approximately 3.1 to 12.3 dB greater with twenty five percent (25%) duty cycle. The input impedance is approximately 1.3 to 10.7 times higher with twenty five percent (25%) duty cycle, with highest factor of increase at highest load impedance. The IIP3 is approximately the same, and voltage gain is higher with twenty five percent (25%) duty cycle.

A third set of comparisons (Case 3) shows simulation results for the image balance mixer as shown in FIG. 6A. The phase combiner is designed for the expected driving impedance (resistance). The phase accuracy and image rejection achieved by the phase combiner is very sensitive to the actual drive impedance. For the mixer field-effect transistors (FET) and RF source impedance used here, the output impedance of the I and Q mixers is about 1.8K, so the phase combiner is designed with r0=1.8K. The impedance presented by the mixers to the phase combiner is not constant, due to the resonant band pass response of Ls and Cs, and so the image balance varies over the +/−10 MHz IF range shown in the simulation plots, with optimal image rejection at the IF center frequency. It can be seen from the results that a single sideband noise figure of less than 2 dB is achievable using the image balance mixer of FIG. 6A, even with a load resistance of 200 Ohms The power loss of the image balance mixer with a 200 Ohm load is about 4.3 dB. The RF source impedance used in all the simulations was 200 Ohms The on-resistance of the FET switches used in the mixers is about 33 Ohms, except for the last simulation in Case 3 with Rload=200, where the switch FET sizes were doubled, halving the switch ON resistance. From the results, it can be seen that halving the switch on-resistance had very little effect on the gain, slightly improved the noise figure, but improved the IIP3 by about 4.1 dB to +22.2 dBm. The switch size could be increased significantly further (reducing the switch ON-resistance) to effect a further improvement in IIP3. Note that although for this case the image rejection decreases to about 12.5 dB at the band edges, this is still enough to maintain the noise figure to just about 2 dB at +/−10 MHz from the center frequency. The degradation in image rejection with increased switch size (lower ON resistance) is due to a shift in the mixer output impedance which drives the phase combiner. The degradation could be mitigated by redesigning the phase combiner for the new driving impedance.

In Case 3, single sideband noise figure of less than 2 dB can be achieved (approximately 3 dB better than non-image balanced). The noise figure improves slightly with increased size of mixer switch FETs. Insertion Loss of approximately 2 dB can be achieved with load resistance around 1K. The power loss increases to approximately 4.3 dB with load resistance of 200 Ohms. There is good input match to 200 Ohms This case also provides for good IIP3 which improves with increased size of mixer switch FETs (see 2nd Rload=200 Ohms case above). With a totally passive approach, good image suppression can be achieved near the center of the IF pass-band (+/−~2 MHz) but not over 20 MHz BW (due to changing impedance driving the LC phase combiner).

Figure 8A:
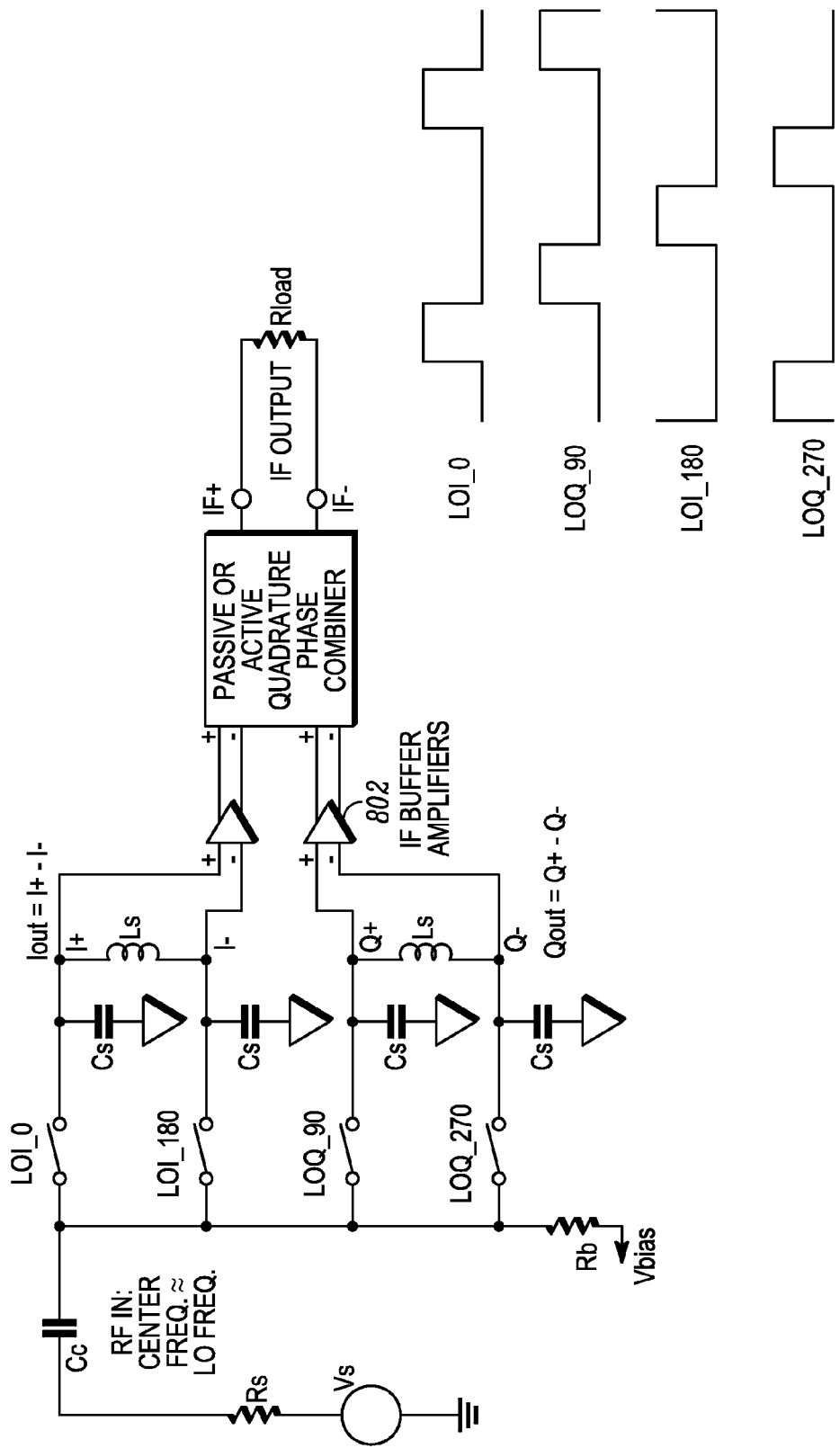
FIG. 8A is another schematic of an image reject heterodyne commutating IQ mixer in accordance with some embodiments.

FIG. 8A is another schematic of an image reject heterodyne commutating IQ mixer used in accordance with some embodiments. The image reject heterodyne commutating IQ mixer of FIG. 8A is single balanced with IF buffers 802.

Figure 8B:
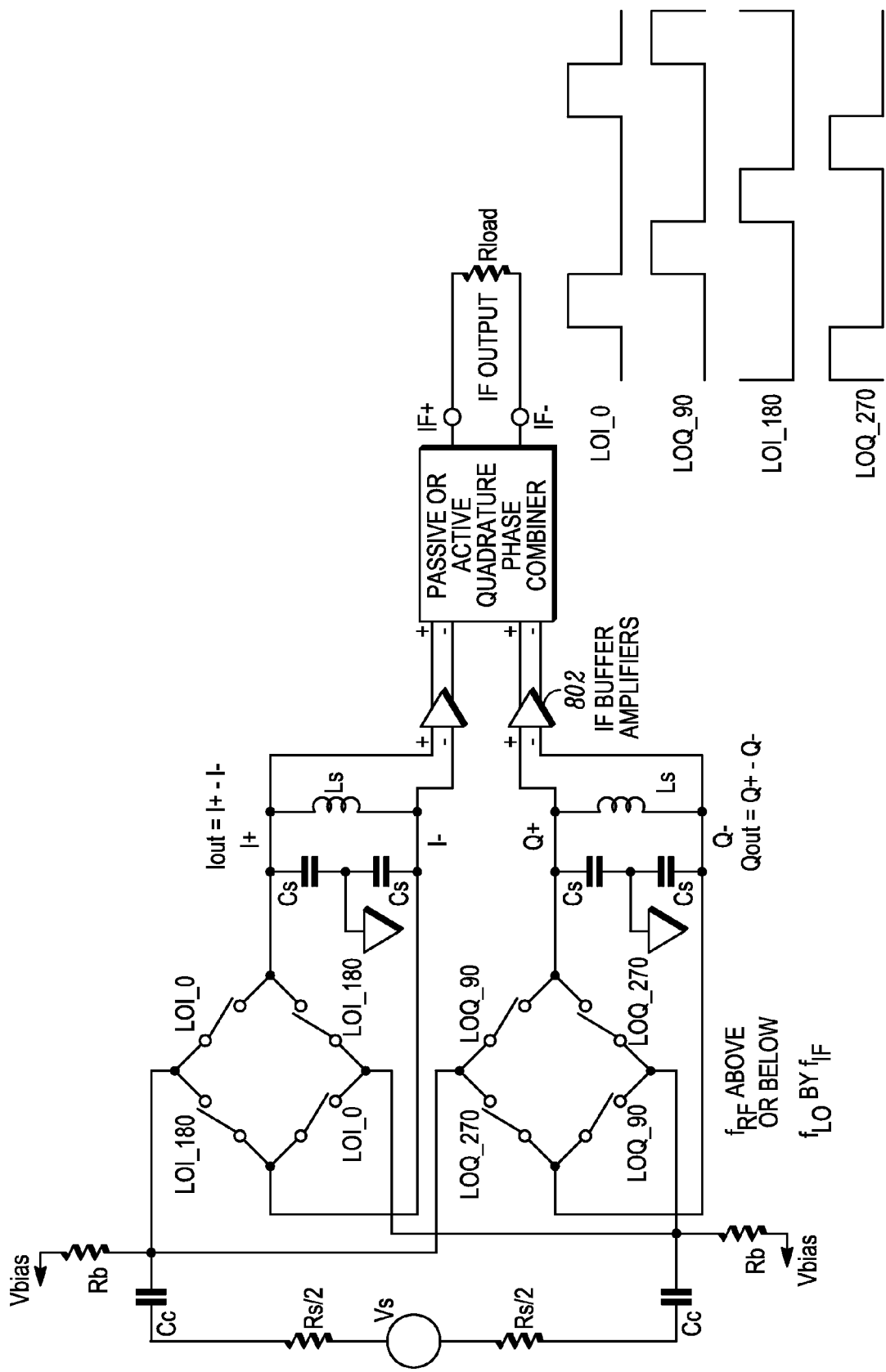
FIG. 8B is another schematic of an image reject heterodyne commutating IQ mixer in accordance with some embodiments.

FIG. 8B is another schematic of an image reject heterodyne commutating IQ mixer used in accordance with some embodiments. The image reject heterodyne commutating IQ mixer of FIG. 8B is double balanced with IF buffers 802.

Returning to FIG. 7, in Case 4, unity voltage gain ideal buffers (with no noise or distortion and infinite input impedance) were used between the differential I and Q mixer outputs in the simulations to drive the phase combiner with constant impedance versus frequency, as shown in FIG. 8A. Resistors were added at the output of the buffers to set the driving impedance to the phase splitter, which in this case was designed for an impedance level (r0) of 200 Ohms using non-ideal integrated circuit (IC) inductors and capacitors. This case was run to verify that good image rejection could be achieved over a broad bandwidth and with integrated circuit (IC) manufacturing tolerances on the phase combiner elements. In actual implementation, the addition of real buffers would, of course, incur some degradation in power drain, distortion (IIP3) and noise figure. With the addition of the buffers, various other types of quadrature phase combiners could be used, since the buffers could be used to provide gain that would take over the noise of a noisy phase combiner. The buffers were used only in the simulations for Case 4, and were noiseless and distortionless. The resistors added at the buffer outputs contributed to the noise figure in the simulations for Case 4.

Figure 10B:
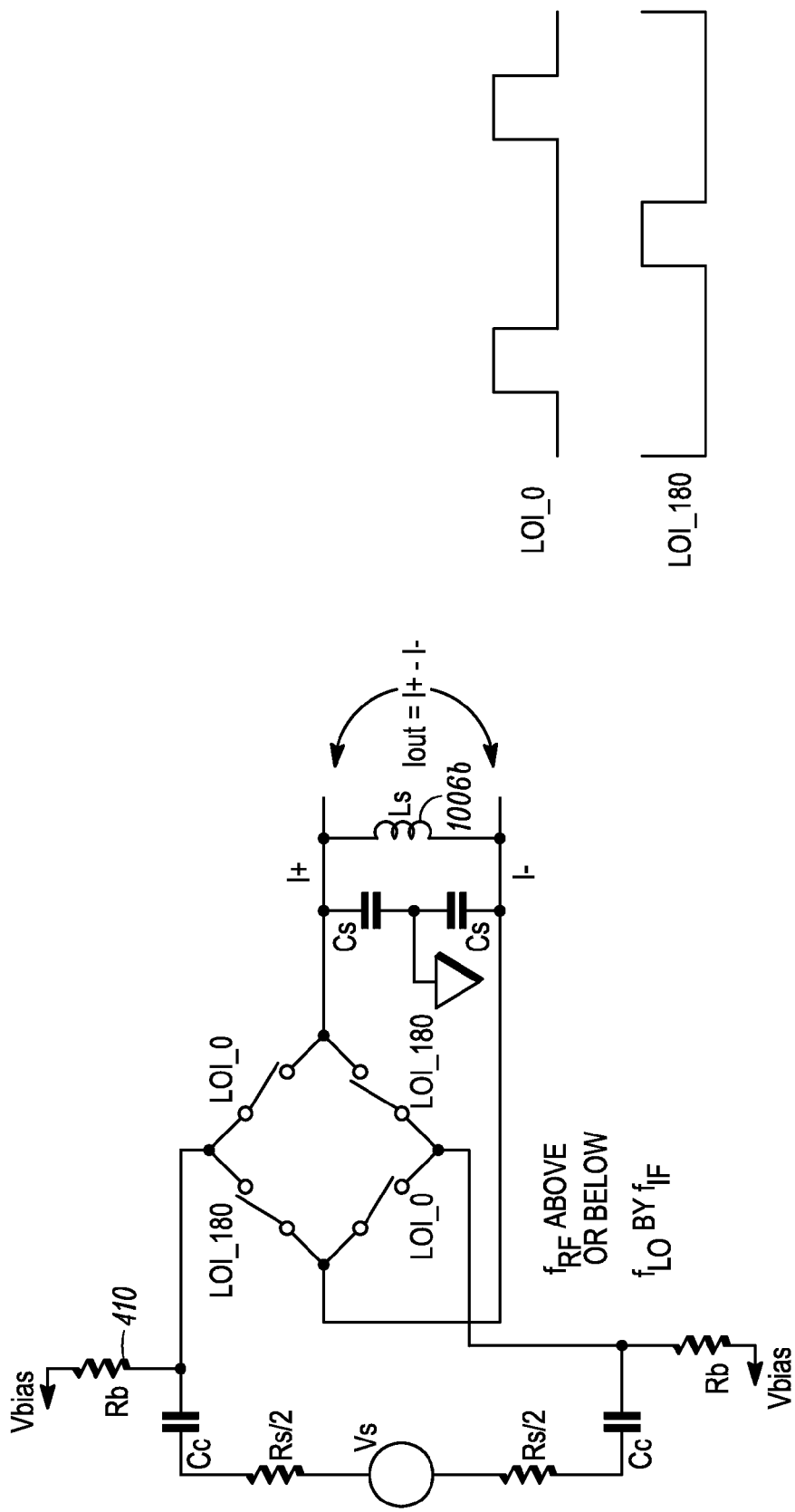
FIG. 10B is a schematic diagram of a double balanced commutating heterodyne mixer with a single differential output, which could be used in heterodyne applications in which both I and Q outputs are not needed.

Although a single balanced mixer topology was used for the simulations, the double balanced topology could also be used. FIG. 4B shows a double balanced heterodyne commutating IQ mixer that could be used as an alternative to the single balanced version of FIG. 4A. FIG. 6B shows a double balanced image reject heterodyne commutating mixer which could be used as an alternative to the single balanced version of FIG. 6A. FIG. 8B shows a double balanced image reject heterodyne commutating IQ mixer which could be used as an alternative to the single balanced version of FIG. 8A. FIG. 10B shows a double balanced heterodyne commutating mixer with one differential output which could be used as an alternative to the single balanced version of FIG. 10A. The double balanced configuration generally has advantages in improved cancellation of even order distortion products and improved isolation from the LO to the RF input port. These improvements are highly dependent upon matching of the mixer circuit elements, and are not included in FIG. 7. Most of the other comparison results shown would result in similar relative conclusions for the double balanced configurations, although the single balanced configurations give about 6 dB greater voltage gain than their respective double balanced configurations if the same source and load impedances and the same switch sizes are used. Compared to the single balanced implementations using identical switches, the noise figure using the double balance mixers and twenty five percent (25%) duty cycle is generally less than one dB worse, while the IIP3 tends to be a few dB better.

For an image balanced IQ heterodyne mixer based on twenty five percent (25%) duty cycle using buffers on the mixer IQ outputs driving a 2-section LC phase combiner, such as is shown in FIG. 9, with constant impedance, good image suppression can be achieved over 20% or more of the IF center frequency. The specific design of the IF buffers will impact current drain, noise figure, and IIP3, but good noise figure and IIP3 and low current should be achievable. The buffers would constitute an IF amplifier. LC quadrature combiners with additional sections could be used to extend the bandwidth over which good image suppression can be achieved. Other types of quadrature combiners could also be used.

Figure 11:
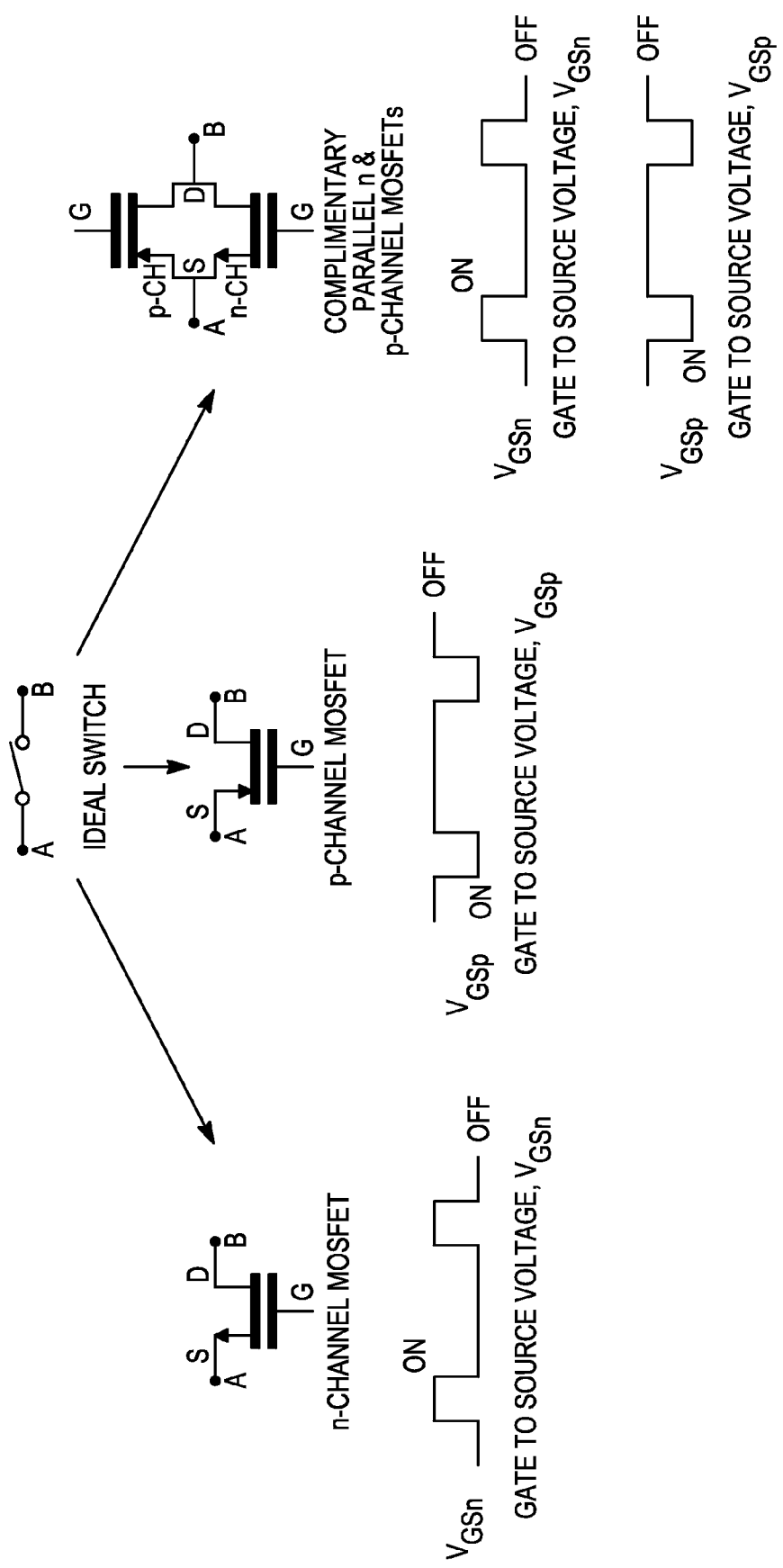
FIG. 11 is a diagram showing that metal oxides semiconductor field effect transistors (MOSFETs) can be used to implement the switches shown in previous figures.

FIG. 11 illustrates that the switches shown in previous figures could be implemented using metal oxide semiconductor field effect transistors (MOSFETs) in several configurations, including a single or multiple parallel n-channel MOSFET(s), a single or multiple parallel p-channel MOSFET(s), or a combination of n-channel and p-channel MOSFETs. Those skilled in the art will appreciate that the appropriate ON-state and OFF-state gate to source voltages are dependent upon the specific semiconductor technology used, and that the circuit voltages need to be biased at appropriate DC levels. Exemplary means of biasing the drain and source voltages are discussed above, and other means, such as use of center tapped transformers with center tap to a DC bias voltage, use of bias resistors or "choke" inductors at each of the output terminals could also be used.

Figure 12:
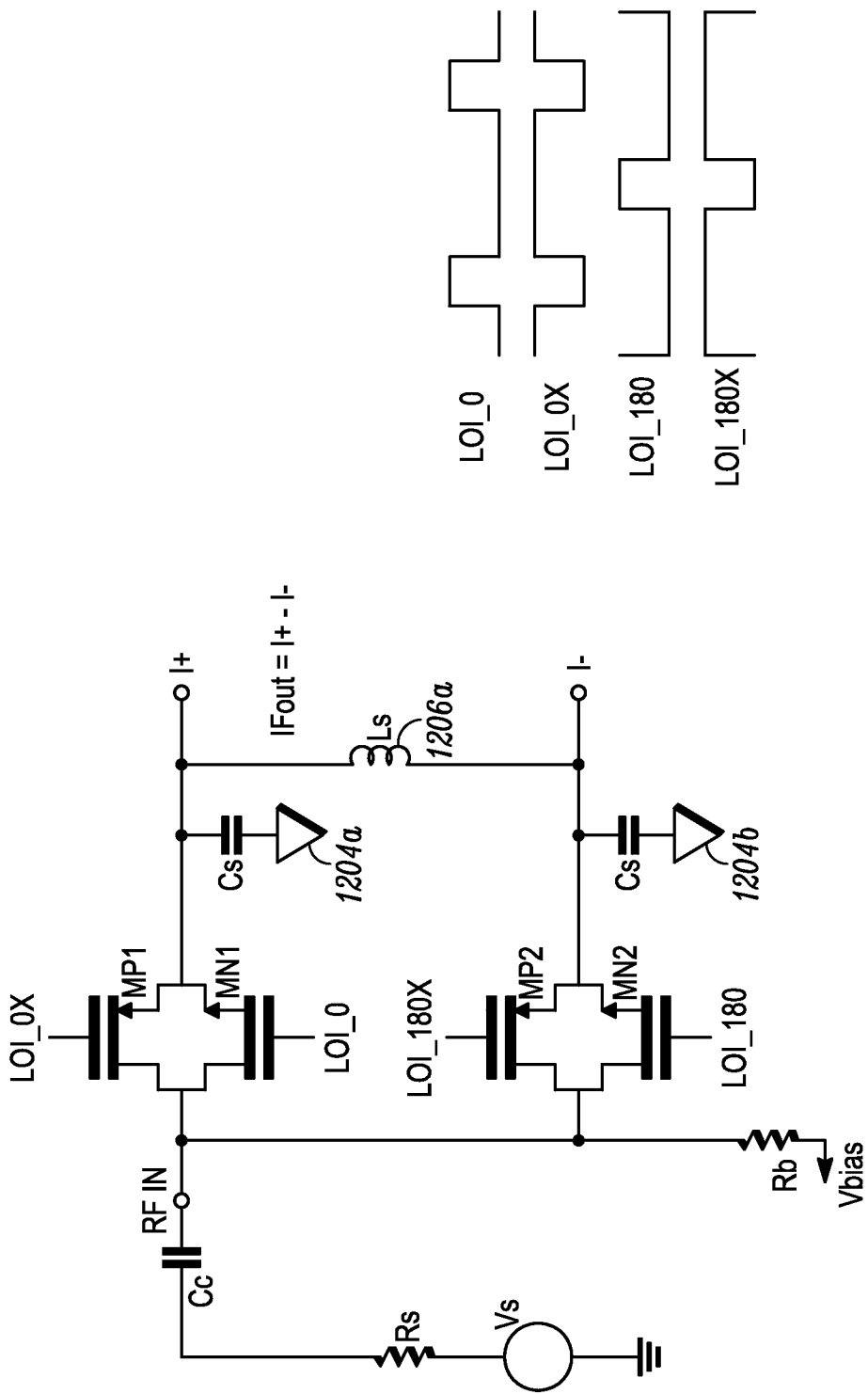
FIG. 12 is a schematic diagram of the single balance commutating heterodyne mixer shown in FIG. 10A, with the switches implemented with complimentary p type and n type MOSFETs.

FIG. 12 shows a specific example of implementation of a heterodyne commutating mixer, in this case the mixer of FIG. 10A, using complimentary n-channel and p-channel MOSFETs, as an example.

Embodiments of the new mixer circuits described above should find application in products with high performance requirements, such as base station receivers or other receivers with very high second order intermodulation intercept point specifications which require heterodyne mixers. Embodiments of the new mixer circuits are also applicable in current radios that use a heterodyne mixer for the first IF conversion. It should be noted that embodiments of the mixer circuits described above are applicable to other products that are not specifically noted herein. The applications noted herein are only examples of applications that may use the new mixer circuits described herein.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," "contains . . . a" does not, without more constraints, preclude the existence of additional identical elements in the process, method, article, or apparatus that comprises, has, includes, or contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A heterodyne commutating mixer, comprising:
a plurality of local oscillator inputs;
a plurality of switches for transferring a radio frequency input signal during a plurality of sequential local oscillator period timeslots to at least one output capacitor, wherein the plurality of switches are controlled to be on for a given state of a local oscillator waveform;
at least one output inductor connected to one or more pairs of differential output terminals, wherein values of inductance and capacitance are set to achieve resonance at an output intermediate frequency; and
a radio frequency input, wherein a first terminal of the radio frequency input is at ground potential and a second terminal of the radio frequency input connects to a first terminal of each of two switches,
wherein output of the mixer is taken differentially at second terminals of each of the two switches and wherein at least one capacitor and at least one inductor are connected to the differential output,
wherein each of the at least one capacitor or the at least one inductor on each of the differential outputs has another terminal connected to ground or a direct current potential so as to provide a return path to ground, wherein the values of the at least one capacitor and the at least one inductor are chosen such that resonance is achieved at a desired output intermediate frequency, and
wherein local oscillator signal waveforms at a local oscillator frequency are used to control the switches such that each switch is on with a duty cycle of less than fifty percent and neither switch is on at the same time.

2. The mixer of claim 1, wherein a local oscillator frequency is chosen to be above or below a frequency of a desired input signal by an amount equal to the output intermediate frequency.

3. The mixer of claim 1, wherein each of the plurality of switches is implemented in one or more transistors.

4. The mixer of claim 1, wherein the duty cycle of the local oscillator waveforms is twenty five percent such that each switch is on for twenty five percent of the local oscillator period.

5. The mixer of claim 1, wherein a capacitor is connected from each output terminal to ground.

6. A heterodyne commutating mixer comprising:
a plurality of local oscillator inputs;
a plurality of switches for transferring a radio frequency input signal during a plurality of sequential local oscillator period timeslots to at least one output capacitor, wherein the plurality of switches are controlled to be on for a given state of a local oscillator waveform;
at least one output inductor connected to one or more pairs of differential output terminals,
wherein values of inductance and capacitance are set to achieve resonance at an output intermediate frequency; and
a radio frequency input, wherein a first terminal of the radio frequency input connects to a first terminal of each of a first switch and a second switch and a second terminal of the radio frequency input connects to a first terminal of each of a third switch and a fourth switch,
wherein a second terminal of the first switch and a second terminal of the third switch connect to a positive output terminal of the mixer and a second terminal of the second switch and a second terminal of the fourth switch connect to a negative output terminal of the mixer, and wherein the positive output terminal and negative output terminal comprise a differential output across which at least one capacitor and at least one inductor are connected,
wherein the values of the at least one capacitor and the at least one inductor are chosen to achieve resonance at a desired intermediate output frequency, and
wherein the first switch and the fourth switch are controlled to be on or off by a first local oscillator signal waveform at a local oscillator frequency and the second switch and the third switch are controlled to be on or off by a second local oscillator signal waveform at the same local oscillator frequency, wherein the local oscillator signal waveforms are used to control the switches such that the switches are on with a duty cycle of less than fifty percent and wherein the first switch and the fourth switch are never on at the same time as the second switch and the third switch.

7. The mixer of claim 6, wherein the duty cycle of the local oscillator waveforms is twenty five percent such that each switch is on for twenty five percent of the local oscillator period.

8. The mixer of claim 6, wherein a capacitor is connected from each output terminal to ground.

9. A heterodyne commutating mixer, comprising:
a plurality of local oscillator inputs;
a plurality of switches for transferring a radio frequency input signal during a plurality of sequential local oscillator period timeslots to at least one output capacitor, wherein the plurality of switches are controlled to be on for a given state of a local oscillator waveform;
at least one output inductor connected to one or more pairs of differential output terminals,
wherein values of inductance and capacitance are set to achieve resonance at an output intermediate frequency; and
a radio frequency input wherein a first terminal of the radio frequency input is at ground potential and a second terminal of the radio frequency input connects to a first terminal of each of four switches,
wherein a second terminal of each of a first switch and a third switch comprises a differential in-phase output, across which a first set of at least one capacitor and at least one inductor are connected, wherein the values of the first set of at least one capacitor and at least one inductor are chosen to achieve resonance at a desired intermediate output frequency,
wherein a second terminal of each of a second switch and a fourth switch comprises a differential quadrature-phase output, across which a second set of at least one capacitor and at least one inductor are connected, wherein the values of the second set of the at least one capacitor and the at least one inductor are chosen to achieve resonance at a desired intermediate output frequency,
wherein at least one of the capacitors or the inductors on each of the differential outputs has its other terminal connected to ground or a direct current potential so as to provide a return path to ground, and
wherein the four switches are controlled by four sequential local oscillator signal waveforms at a local oscillator frequency such that the first switch, the third switch, the second switch and the fourth switch are turned on sequentially over the local oscillator period.

10. The mixer of claim 9, wherein the duty cycle of the local oscillator waveforms is twenty five percent such that each switch is on for twenty five percent of the local oscillator period.

11. The mixer of claim 9, wherein a capacitor is connected from each output terminal to ground.

12. The mixer of claim 9, wherein the differential in-phase output and the differential quadrature-phase output are connected to a quadrature phase combiner, wherein a phase combiner output provides a mixer output with rejection of an unwanted image response.

13. The mixer of claim 12, wherein the quadrature phase combiner is passive.

14. The mixer of claim 12, wherein the duty cycle of the local oscillator waveforms is twenty five percent such that each switch is on for twenty five percent of the local oscillator period.

15. The mixer of claim 12, wherein a capacitor is connected to ground from each of in-phase and quadrature-phase output terminals which connect to quadrature phase combiner inputs.

16. The mixer of claim 12, wherein buffers or amplifiers are connected between the differential in-phase and quadrature-phase outputs and inputs to the quadrature phase combiner.

17. The mixer of claim 16 wherein the quadrature phase combiner is passive.

18. The mixer of claim 16, wherein the duty cycle of the local oscillator waveforms is twenty five percent such that each switch is on for twenty five percent of the local oscillator period.

19. The mixer of claim 16, wherein a capacitor is connected to ground from each of in-phase and quadrature-phase output terminals which connect to quadrature phase combiner inputs.

20. A heterodyne commutating mixer, comprising:
a plurality of local oscillator inputs;
a plurality of switches for transferring a radio frequency input signal during a plurality of sequential local oscillator period timeslots to at least one output capacitor, wherein the plurality of switches are controlled to be on for a given state of a local oscillator waveform;
at least one output inductor connected to one or more pairs of differential output terminals,
wherein values of inductance and capacitance are set to achieve resonance at an output intermediate frequency; and
a differential radio frequency input, wherein a first terminal of the radio frequency input connects to a first terminal of each of a first switch, a second switch, a fifth switch, and a sixth switch, and wherein a second terminal of the radio frequency input connects to a first terminal of each of a third switch, a fourth switch, a seventh switch and an eighth switch,
wherein a second terminal of the first switch and a second terminal of the third switch connect to a positive in-phase output terminal of the mixer, wherein a second terminal of the second switch and a second terminal of the fourth switch connect to a negative in-phase output terminal of the mixer, wherein a second terminal of the fifth switch and a second terminal of the seventh switch connect to a positive quadrature-phase output terminal of the mixer, and wherein a second terminal of the sixth switch and a second terminal of the eighth switch connect to a negative quadrature-phase output terminal of the mixer,
wherein the positive and negative in-phase output terminals comprise a differential output across which a first set of at least one capacitor and at least one inductor are connected, wherein the values of said first set of at least one capacitor and at least one inductor are chosen to achieve resonance at a desired intermediate output frequency,
wherein the positive and negative quadrature-phase output terminals comprise a differential output across which a second set of at least one capacitor and at least one inductor are connected, wherein the values of the second set of at least one capacitor and at least one inductor are chosen to achieve resonance at a desired intermediate output frequency,
wherein the first switch and the fourth switch are controlled to be on or off by a first local oscillator signal waveform at a local oscillator frequency, the second switch and the third switch are controlled to be on or off by a third local oscillator signal waveform at the same local oscillator frequency, the fifth switch and the eighth switch are controlled to be on or off by a second local oscillator signal waveform at the same local oscillator frequency, and the sixth switch and the seventh switch are controlled to be on or off by a fourth local oscillator signal waveform at the same local oscillator frequency,
wherein the local oscillator signal waveforms are used to control the switches such that the switches are on with a duty cycle of less than fifty percent, wherein the first switch and the fourth switch are never on at the same time as the second switch and the third switch and the fifth switch and the eighth switch are never on at the same time as the sixth switch and the seventh switch, and
wherein the switches are controlled by four sequential local oscillator signal waveforms at a local oscillator frequency such that the four groups of switches, the first switch and the fourth switch, the fifth switch and the eighth switch, the second switch and the third switch, and the sixth switch and the seventh switch, are turned on sequentially over the local oscillator period.

21. The mixer of claim 20, wherein the duty cycle of the local oscillator waveforms is twenty five percent such that each switch is on for twenty five percent of the local oscillator period.

22. The mixer of claim 20, wherein a capacitor is connected from each output terminal to ground.

23. The mixer of claim 20, wherein the differential in-phase and differential quadrature-phase outputs are connected to a quadrature phase combiner, wherein a phase combiner output provides a mixer output with rejection of an unwanted image response.

24. The mixer of claim 23, wherein the quadrature phase combiner is passive.

25. The mixer of claim 23, wherein the duty cycle of the local oscillator waveforms is twenty five percent such that each switch is on for twenty five percent of the local oscillator period.

26. The mixer of claim 23, wherein a capacitor is connected to ground from each of the in-phase and quadrature-phase output terminals which connect to quadrature phase combiner inputs.

* * * * *